United States Patent
De Flaviis (10) Patent No.: US 7,420,437 B2
(45) Date of Patent: *Sep. 2, 2008

(54) COMPACT BALUN WITH REJECTION FILTER FOR 802.11A AND 802.11B SIMULTANEOUS OPERATION

(75) Inventor: Franco De Flaviis, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/729,928

(22) Filed: Mar. 30, 2007

(65) Prior Publication Data

US 2007/0170999 A1 Jul. 26, 2007

Related U.S. Application Data

(63) Continuation of application No. 11/138,317, filed on May 27, 2005, now Pat. No. 7,202,757, which is a continuation of application No. 10/704,915, filed on Nov. 12, 2003, now Pat. No. 6,900,706, which is a continuation of application No. 10/232,620, filed on Sep. 3, 2002, now Pat. No. 6,891,448, and a continuation of application No. 10/232,617, filed on Sep. 3, 2002, now Pat. No. 6,791,431.

(51) Int. Cl.
*H01P 5/10* (2006.01)
*H01P 3/08* (2006.01)

(52) U.S. Cl. .................. 333/26; 333/116

(58) Field of Classification Search .................. 333/25, 333/26, 116
See application file for complete search history.

(56) References Cited

U.S. PATENT DOCUMENTS 4,375,699 A   3/1983   Hallford
5,455,545 A   10/1995  Garcia (Continued)

FOREIGN PATENT DOCUMENTS

DE   2144985   3/1973

OTHER PUBLICATIONS

Piernas B. et al., "Improvement of the Design of 180 DEG Rat-Race Hybrid", Electronics Letters, GB, vol. 36, No. 12, pp. 1035-1036 (Jun. 2000).

(Continued)

*Primary Examiner*—Dean O Takaoka
(74) *Attorney, Agent, or Firm*—Sterne, Kessler, Goldstein & Fox PLLC (57) ABSTRACT

A balancing/unbalancing (balun) structure for operating at frequency $f_1$ includes a microstrip printed circuit board (PCB). A balun on the PCB includes two input ports are coupled to a differential signal. An isolated port is connected to ground through a matched resistance. An output port is coupled to a single-ended signal corresponding to the differential signal. A plurality of traces on the PCB connect the two input ports, the load connection port and a tap point to the output port. A $f_2$ rejection filter on the PCB is wrapped around the balun and includes a first folded element with a transmission length of $\lambda_2/4$ and connected to the output port. A second folded element has a transmission length of $\lambda_2/4$ and connected to the tap point. A third folded element connects the tap point to the output port and has a transmission length of $\lambda_2/4$.

19 Claims, 6 Drawing Sheets

U.S. PATENT DOCUMENTS

| | | | |
|---|---|---|---|
| 5,936,594 | A | 8/1999 | Yu et al. |
| 6,018,277 | A | 1/2000 | Vaisanen |
| 6,300,919 | B1 | 10/2001 | Mehen et al. |
| 6,515,556 | B1 | 2/2003 | Kato et al. |
| 6,791,431 | B2 | 9/2004 | De Flaviis |
| 6,891,448 | B2 | 5/2005 | De Flaviis |
| 6,900,706 | B2 | 5/2005 | De Flaviis |
| 7,202,757 | B2 | 4/2007 | De Flaviis |

OTHER PUBLICATIONS

Settaluri Raghu K. et al., "Compact Folded Line Rat-Race Hybrid Couplers", IEEE Microwave Guided Wave Lett; IEEE Translations on Microwave and Guided Wave Letters, Feb. 2000, IEEE, vol. 10, No. 2, pp. 61-63.

Settaluri R. K. et al., "Design of Compact Multi-Level Folded-Line RF Couplers", 1999 IEEE MTT-S International Microwave Symposium Digest. IEEE Transactions on Microwave Theory and Techniques, vol. 47, No. 12, pp. 2331-2339 (Dec. 1999).

Matsuura, H. et al., "*Monolithic Rat-Race Mixers for Millimeter Waves*", IEEE, pp. 101-104 (Jul. 2004).

Johnson, K.M., "*X-Band Integrated Circuit Mixer with Reactively Terminated Image*", Transactions on Microwave Theory and Techniques, IEEE, vol. 16, No. 7, pp. 388-397 (Jul. 1968).

European Search Report issued Jan. 13, 2004 for Appl. No. EP/03019915.2 4 pages.

European Search Report Issued Jan. 13, 2004 for Appl. No. EP/03019914.5, 4 pages.

FASE=PHASE(S(2,1))−PHASE(S(4,1))

COMPACT BALUN WITH REJECTION FILTER FOR 802.11A AND 802.11B SIMULTANEOUS OPERATION

CROSS-REFERENCE TO RELATED APPLICATIONS

This application is a continuation of application Ser. No. 11/138,317, filed May 27, 2005, now U.S. Pat. No. 7,202,757, which is a continuation of U.S. patent application Ser. No. 10/704,915, filed Nov. 12, 2003 now U.S. Pat. No. 6,900,706, which is a continuation of U.S. patent application Ser. No. 10/232,620, filed on Sep. 3, 2002, now U.S. Pat. No. 6,891,448, and which is also a continuation of U.S. patent application Ser. No. 10/232,617, filed on Sep. 3, 2002, now U.S. Pat. No. 6,791,431, all of which are incorporated by reference herein.

FIELD OF THE INVENTION

The present invention is related to balancing/unbalancing structures, or "baluns," for use in gigahertz wireless applications with multiple frequencies of operation.

RELATED ART

There is an increasing demand for wireless devices that are capable of communicating in multiple frequency bands. For example, a wireless device configured for the United States and European markets may require the ability to operate in four bands: the European cellular telephone band (880-960 MHz), the United States PCS band (1850-1990 MHz), the Bluetooth band (2.4-2.5 GHz) and the 802.11a unlicensed band (5.15-5.25 GHz).

A balun (short for BALanced to Unbalanced) is a transformer connected between a balanced source or load (signal line) and an unbalanced source or load (signal line). A balanced line has two signal line conductors, with equal currents in opposite directions. The unbalanced signal line has just one conductor, where the current in it returns via a common ground or earth path. Typically, an RF balun function is implemented as an off-chip transformer or as a quarter wave hybrid (lumped or microstrip) integrated into an RF circuit board.

RF wireless circuits utilize balanced outputs of signals to minimize the effect of ground inductance and to improve common mode rejection. Circuits that benefit from balanced operation include mixers, modulators, IF strips and voltage controlled oscillators. These balanced outputs, moreover, consist of differential signals which must be combined to provide a single ended output signal. Thus, a balun is a RF balancing network or electric circuit for coupling an unbalanced line or device and a balanced line or device for the purpose of transforming from balanced to unbalanced or from unbalanced to balanced operation, with minimum transmission losses. A balun can be used with an unbalanced input and a pair of balanced outputs or, in the reverse situation, a pair of balanced sources and an unbalanced load. Baluns can be used to interface an unbalanced input with a balanced circuit by dividing the signal received at its unbalanced terminal equally to two balanced terminals, and by providing the signal at one balanced terminal with a reference phase and the signal at the other balanced terminal with a phase that is 180° out-of-phase relative to the reference phase. Plus or minus 180° baluns can be used to interface a balanced or differential input from a balanced port of a balanced circuit providing output signals which are equal in magnitude but 180° out-of-phase and an unbalanced load driven by a single-ended input signal. The balun combines the signals of the balanced input and provides the combined signal at an another port.

A 180° hybrid device is constructed from several sections of quarter-wavelength transmission lines and a section of half-wavelength transmission line. The drawbacks of the 180° hybrid device are larger size, difficulty in achieving a high impedance transformation ratio, and limitation to a balanced pair of unbalanced outputs.

A particular problem that exist in the context of multi-frequency operation is the interference between the various bands. For example, a device that needs to operate in both the unlicensed band (5.3 GHz) and the Bluetooth band (2.4-2.5 GHz) will experience interference from the other band. This is illustrated in FIG. 1.

Figure 1:
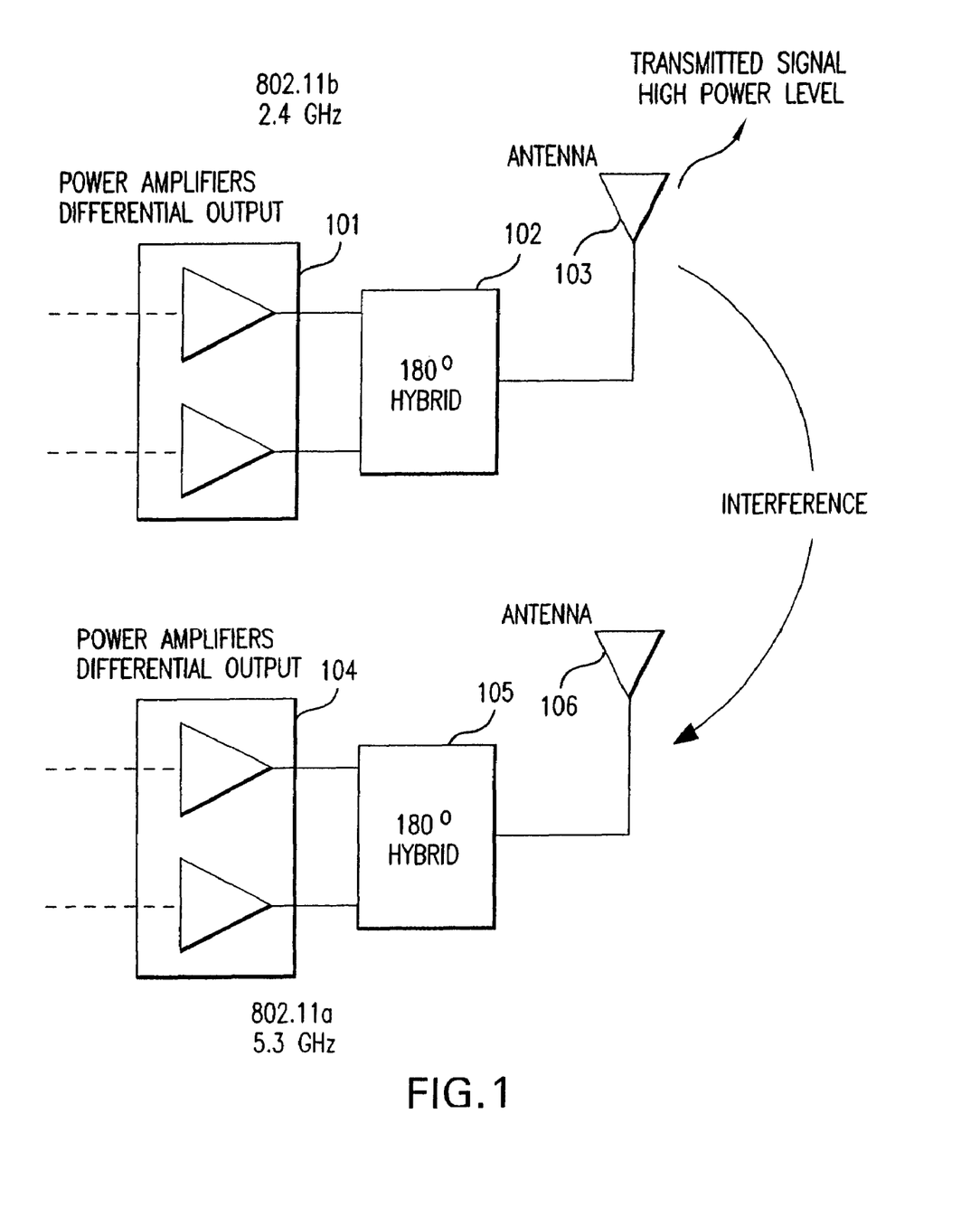
FIG. 1 illustrates the interference problem due to multi-band operation.

As shown in FIG. 1, the RF device includes power amplifiers 101 with differential outputs for 2.4 GHz operation, a 180° hybrid balun 102 for converting to single ended signal, and an antenna 103 that transmits at 2.4 GHz. The RF device also includes a power amplifier 104 with differential output for 5.3 GHz operation, a 180° hybrid balun 105, and an antenna 106. The 5.3 GHz antenna 106 will receive signals from the 2.4 GHz antenna 103, causing interference and cross-talk in the 5.3 GHz circuitry from 2.4 GHz signal.

Accordingly, a need exists for a balun circuit that occupies a minimal amount of space that would filter out undesirable interference and cross-talk from other bands of operation.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

Figure 2:
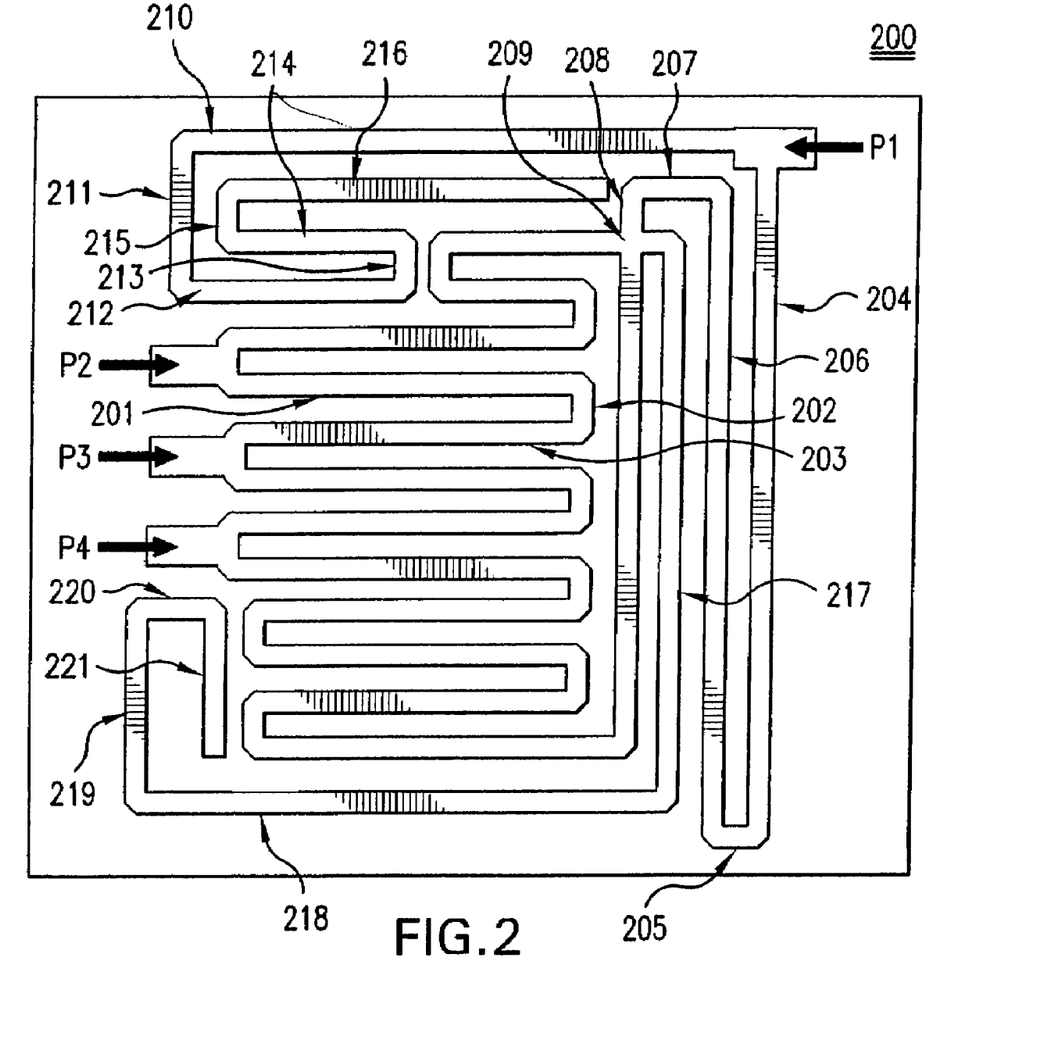
FIG. 2 shows a layout of a 180° hybrid balun that incorporates a 3-pole rejection filter.

FIG. 2 illustrates one embodiment of the present invention, where a structure 200 includes a 180° hybrid balun with a built-in rejection filter. As may be seen in FIG. 2, the balun includes a plurality of folded λ/4 elements, one of which is formed by the traces 201, 202 and 203. Each such folded λ/4 element is a quarter wavelength in length, for example, from port P2, to port P3, at the frequency of interest, in this case, 5.3 GHz. As may be seen from FIG. 2, this embodiment includes four such folded λ/4 elements. Ports P2 and P3 are used for differential input. Port P4 is connected to ground through a matched (i.e., 50 Ohm) resistance. A tap point 209 is a quarter wavelength away from the port P2, and three quarters wavelength away from the port P4, in terms of transmission distance. A port P1 is used to connect a single-ended signal. For example, the single-end signal could be connected to an antenna.

For ease of reference, the direction generally from P2 to P1, i.e. left to right in the figure, may be referred to as the horizontal direction, and the perpendicular direction (top to bottom in the figure) may be referred to as the vertical direction, although it will be understood that these designations are nominal.

Further with reference to FIG. 2, the output port P1 is connected to a tap point 209 through a transmission line (trace) comprised of the traces 204, 205, 206, 207 and 208. The transmission distance from the tap point 209 to the output port P1 is a quarter of a wavelength at the frequency $f_2$, in this case, 2.4 GHz, i.e., the frequency that needs to be rejected by the filter. The transmission line formed by the traces 204-208 represents one pole of the rejection filter. Another pole is represented by the λ/4 transmission line formed by the traces 210, 211, 212, 213, 215 and 216. Note that these traces form a number of folded elements (although in this case not λ/4 elements) such that the total area taken up by the transmission line formed by traces 210-216 is minimized.

Another pole of the 3-pole rejection filter is formed by the traces 217, 218, 219, 220 and 221, such that the total transmission line length is λ/4 at $f_2$, or at 2.4 GHz.

The electrical specifications of the desired 180° hybrid and the corresponding substrate data for FR-4 substrate are as follows:

| | |
|---|---|
| Center frequency of operation | $f_0$ = 5.3 GHz |
| Bandwidth | BW = 0.15 GHz (0.3 dB roll off) |
| Substrate thickness | H = 0.2286 mm (top layer) |
| Relative dielectric constant | $\epsilon_r$ = 3.783 |
| Dielectric loss at 5.3 GHz | tanδ = 0.01 |
| Minimum line width | Δs = 0.127 mm |
| Rejection at 2.4 GHz | R > 20 dB |

Note that the distance between the traces needs to be at least twice the thickness of the printed circuit board, to avoid unwanted interference and cross coupling between the traces.

Note further that the folded element formed by the traces 204, 205 and 206 may be thought of as being oriented in the vertical direction. The folded element formed by the traces 212, 213 and 214 is oriented in the horizontal direction, as are the folded λ/4 elements of the balun itself.

Figure 3:
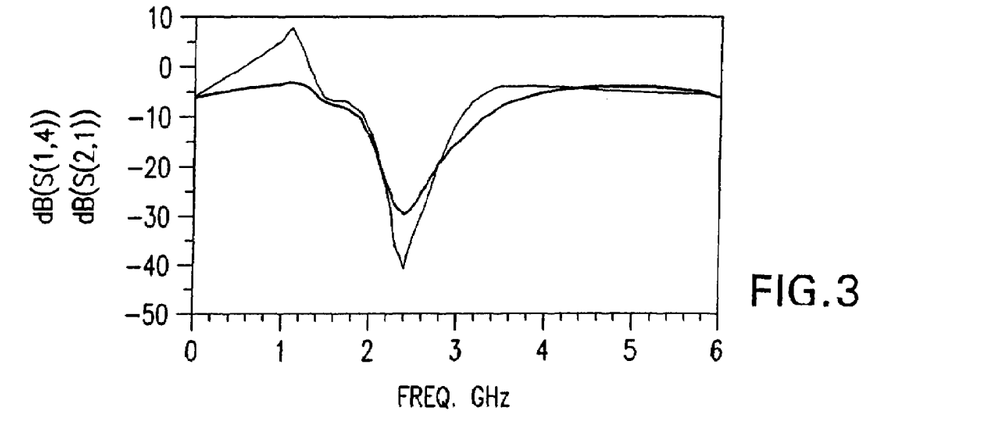
FIG. 3 shows simulated S parameters for the structure shown in FIG. 2.

FIG. 3 illustrates the $S_{14}$ and $S_{21}$ transmission parameters of the structure shown in FIG. 2. As illustrated in FIG. 3, there is a minimum at 2.4 GHz, due to the rejection filter "wrapped around" the balun of FIG. 2.

Figure 4:
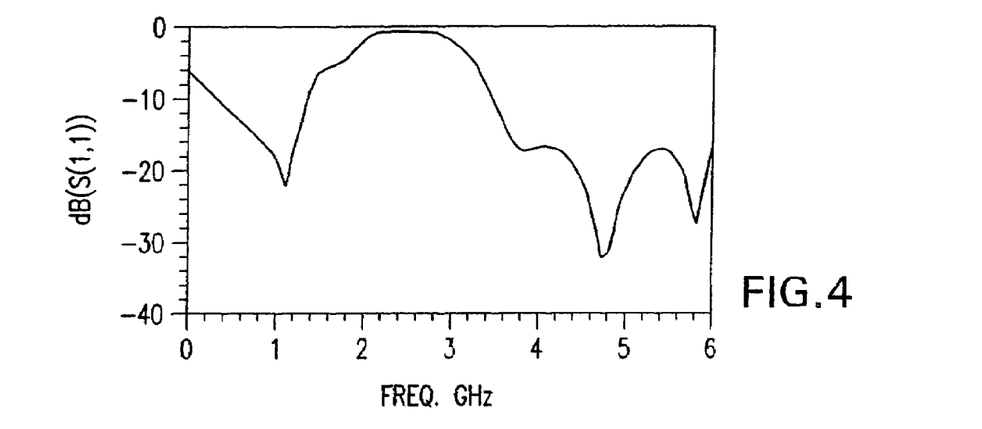
FIG. 4 shows simulated $S_{11}$ parameter for the structure of FIG. 2.

FIG. 4 illustrates the $S_{11}$ transmission parameter of the structure shown in FIG. 2. As shown in FIG. 4, the $S_{11}$ parameter at 5.3 GHz is roughly −16 dB, confirming that the structure is matched to the printed circuit board.

Figure 5:
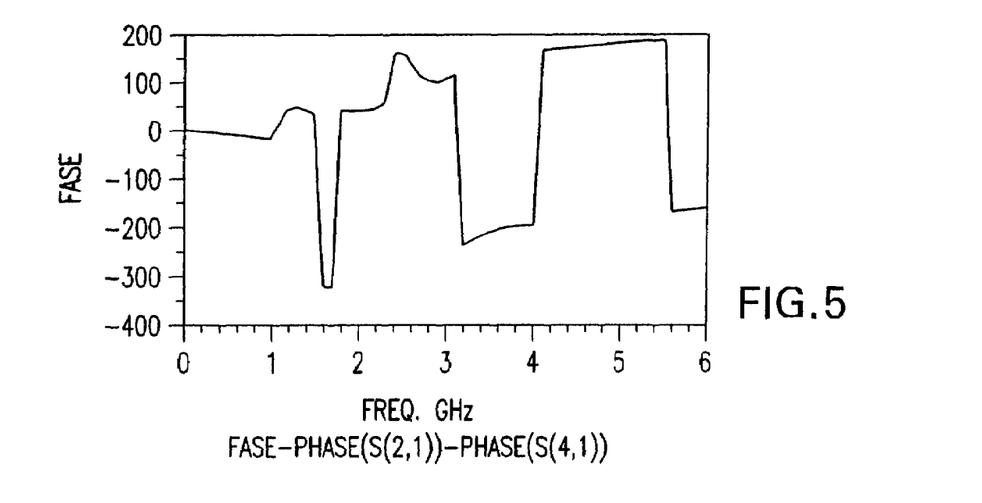
FIG. 5 shows a simulated phase response of the structure of FIG. 2.
Figure 6:
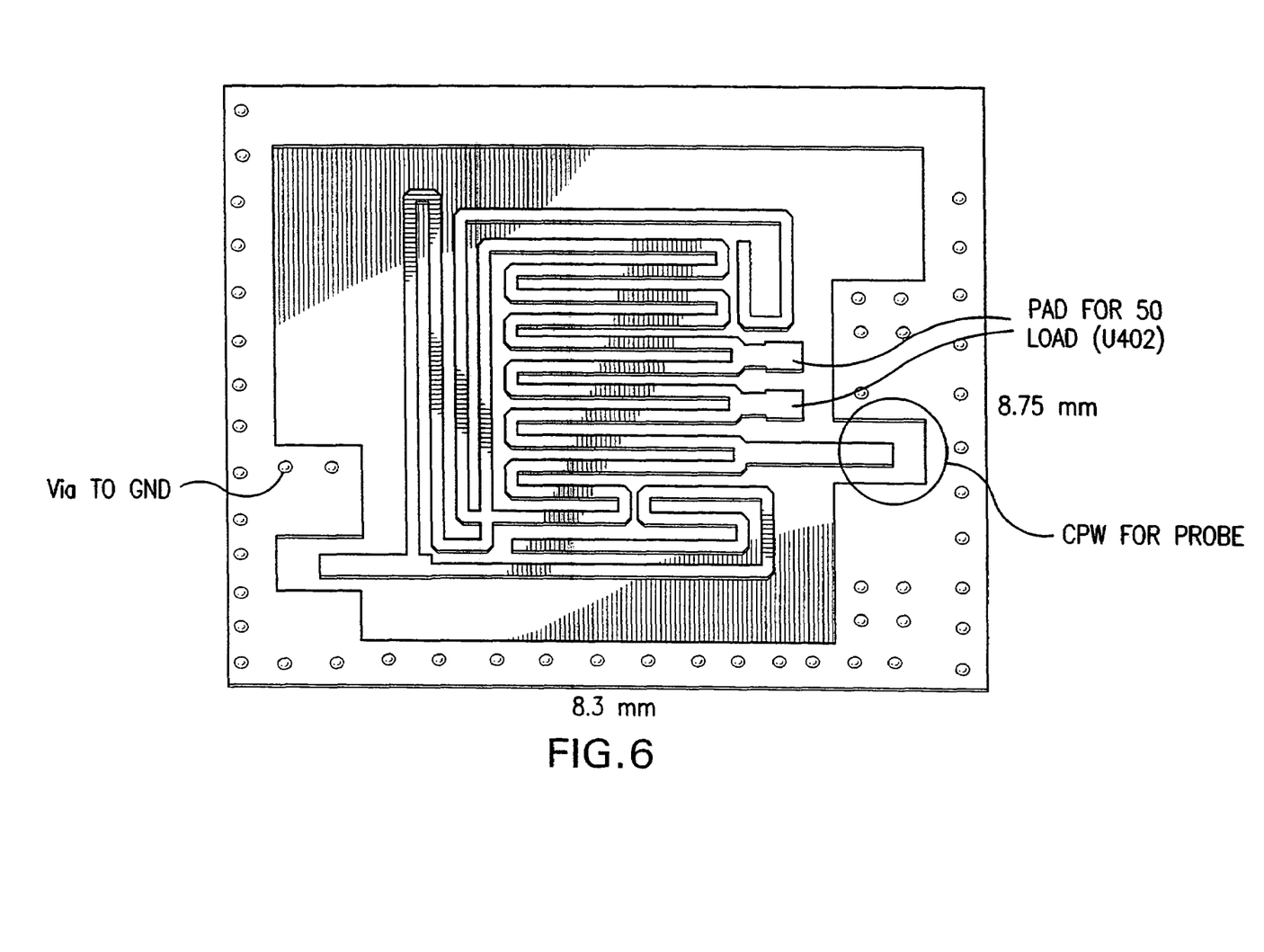
FIGS. 6-9 show measured characteristics of the hybrid balun with rejection filter illustrated in FIG. 2.
Figure 7:
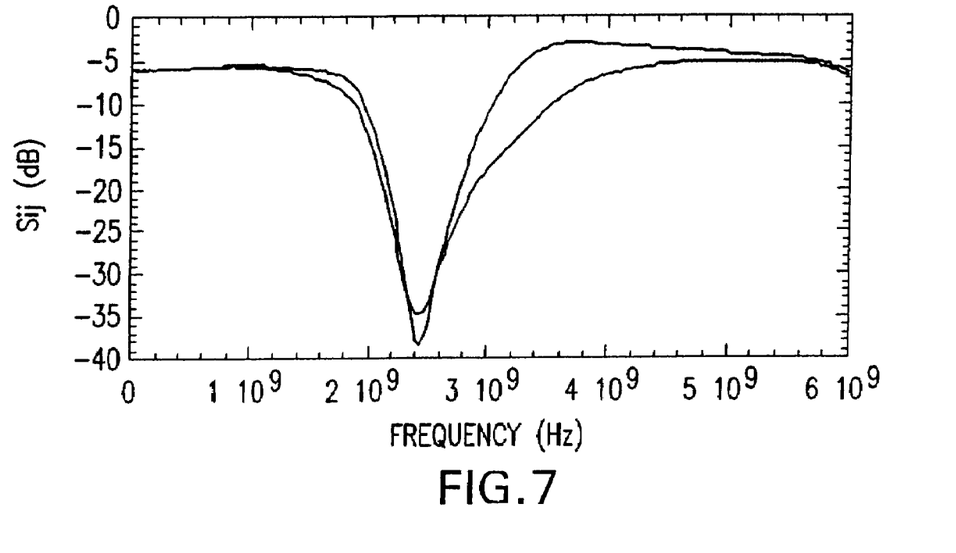
Figure 8:
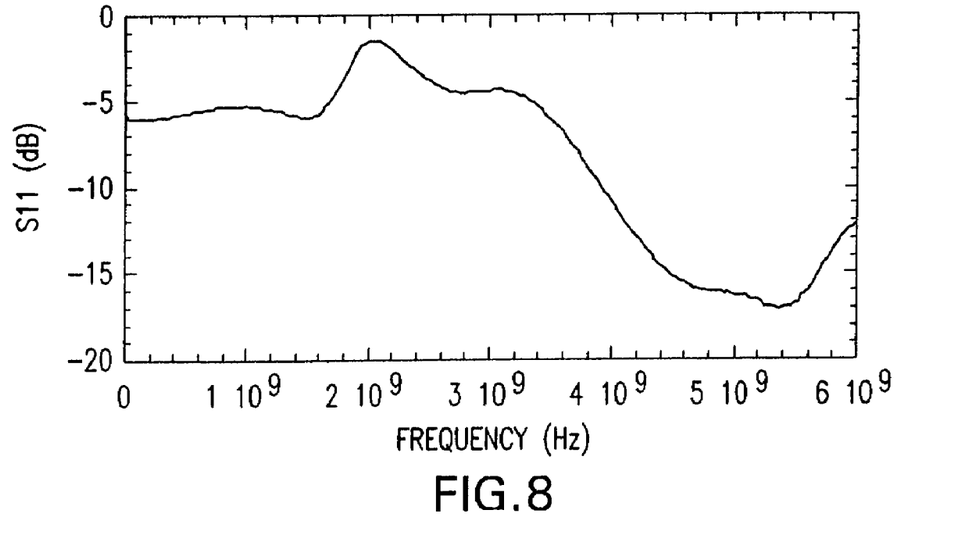
Figure 9:
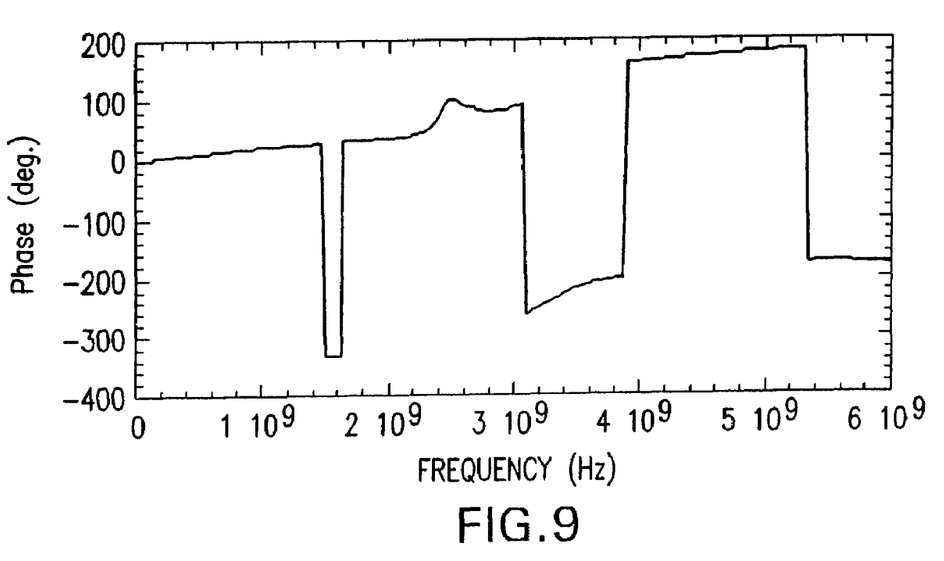

FIG. 5 illustrates the phase response of the device. Of note is the response at 5.3 GHz, which is 180°, as expected of a 180° hybrid balun.

FIGS. 6-9 illustrate measured responses of the device illustrated in FIG. 2, and confirm that actual performance closely matches the predicted performance of FIGS. 3-5.

It will be appreciated that although the particular embodiment described above is directed to filtering out 2.4 GHz interference in a 5.3 GHz system, the invention is not limited to those frequencies. The invention is equally applicable to any two frequencies where the primary frequency of operation is $f_1$, and the potential for interference comes from simultaneously operating at a second frequency $f_2$. Additionally, the invention is not limited to just two frequencies. The same approach may be used to filter out other interfering frequencies of operation, i.e., $f_3$, $f_4$, etc. Furthermore, although the filter that is wrapped around the balun in FIG. 2 is a 3-pole filter, more or fewer poles may be used (obviously, with a corresponding effect on the filter properties). Further still, alternative arrangements of the filter trace lines on the PCB may be employed, and the invention is not limited to the specific arrangement shown in FIG. 2, although FIG. 2 is believed to provide an optimal design that also minimizes the footprint of the overall device while simultaneously providing for good rejection of unwanted interference from a second frequency of operation.

It will be appreciated that while the input ports P3 and P2, and the output port P1 are on opposite sides of the structure, the topology may be rearranged to have them on the same side, if needed.

It will also be appreciated that the balun 200 shown in FIG. 2 may be manufactured on a single layer PCB, where the "bottom" of the PCB is grounded, and the traces shown in FIG. 4 are on the "top." If additional area reduction is required, the balun 200 of FIG. 2 may be folded further using a third layer of tracing (i.e., using a two-substrate PCB), where the middle tracing layer is ground, and the two halves of the "folded in" balun 200 of FIG. 2 are formed on opposite sides of the PCB. Such an arrangement, while reducing the area occupied by the balun 200, requires the addition of vias, which tends to increase parasitics, and reduce the bandwidth. Also, to the extent the space on the bottom of the two substrate PCB was available for use in placing other components, it would obviously not be available if it is used for the balun 200 as described above.

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. A balancing/unbalancing (balun) structure that is configured to operate at a frequency $f_1$ and reject a frequency $f_2$, comprising:

first and second input ports for coupling to a differential signal, a third port for coupling to a single-ended signal corresponding to the differential signal;

a plurality of traces connecting the first and second input ports, and a tap point to the third port;

a first $\lambda_2/4$ element connected to the third port;
a second $\lambda_2/4$ element connected to the tap point and wrapped around the balun; and
a third $\lambda_2/4$ element connecting the tap point to the third port.

2. The balun structure of claim 1, wherein the first and second input ports and the third port are on opposite sides of the balun structure.

3. The balun structure of claim 1, wherein the balun is a 180° hybrid.

4. The balun structure of claim 1, wherein a transmission distance from the first input port to the tap point is $\lambda_1/4$, wherein $\lambda_1$ is a wavelength corresponding to the frequency $f_1$.

5. The balun structure of claim 1, wherein the first $\lambda_2/4$ element is oriented in a direction generally corresponding to a direction from the first and second input ports to the third port.

6. The balun structure of claim 1, wherein the third $\lambda_2/4$ element is oriented in a direction generally perpendicular to a direction from the first and second input ports to the third port.

7. The balun structure of claim 1, wherein $\lambda_2$ is a wavelength corresponding to the frequency $f_2$.

8. A balancing/unbalancing (balun) structure that is configured to operate at a frequency $f_1$ and reject a frequency $f_2$, comprising:
   first and second input ports for coupling to a differential signal,
   a third port for coupling to a single-ended signal corresponding to the differential signal;
   a plurality of traces connecting the first and second input ports, and a tap point to the third port;
   a first $\lambda_2/4$ element connected to the third port;
   a second $\lambda_2/4$ element connected to the tap point; and
   a third $\lambda_2/4$ element connecting the tap point to the third port.

9. The balun of claim 8, wherein $\lambda_2$ is a wavelength corresponding to the frequency $f_2$.

10. An $f_1$ balun with an integrated $f_2$ rejection filter comprising:
    a plurality of transmission lines forming the balun and connecting a first and second input ports, a third port,
    wherein the $f_2$ rejection filter is wrapped around the plurality of transmission lines.

11. The $f_1$ balun of claim 10, wherein the first and second input ports and the third port are on opposite sides of the balun.

12. The $f_1$ balun of claim 10, wherein the balun is a 180° hybrid.

13. The $f_1$ balun of claim 10, wherein a transmission distance from a first input port of the two ports to a tap point is $\lambda_1/4$.

14. The $f_1$ balun of claim 10, wherein the $f_2$ rejection filter includes a first folded element that is oriented in a direction generally corresponding to a direction from the first and second input ports to the third port.

15. The $f_1$ balun of claim 14, wherein the $f_2$ rejection filter includes a second folded element that is oriented in a direction generally perpendicular to a direction from the first and second input ports to the third port.

16. The $f_1$ balun of claim 10, wherein the plurality of transmission lines includes a plurality of folded $\lambda_1/4$ elements.

17. The $f_1$ balun of claim 10, wherein the at least one transmission line element includes a first folded element having a transmission length of $\lambda_2/4$ and connected to the third port.

18. The $f_1$ balun of claim 17, further including a second folded element having a transmission length of $\lambda_2/4$ and connected to the tap point.

19. The $f_1$ balun of claim 18, wherein the second folded element is wrapped around the plurality of transmission lines.

* * * * *